(12) United States Patent
Kurokawa

(10) Patent No.: US 9,122,348 B2
(45) Date of Patent: Sep. 1, 2015

(54) TOUCH PANEL

(75) Inventor: Yoshiyuki Kurokawa, Kanagawa (JP)

(73) Assignee: Semiconductor Energy Laboratory Co., Ltd., Kanagawa (JP)

( * ) Notice: Subject to any disclaimer, the term of this patent is extended or adjusted under 35 U.S.C. 154(b) by 556 days.

(21) Appl. No.: 12/706,839

(22) Filed: Feb. 17, 2010

(65) Prior Publication Data
US 2010/0225615 A1 Sep. 9, 2010

(30) Foreign Application Priority Data

Mar. 9, 2009 (JP) .................................. 2009-054921

(51) Int. Cl.
G06F 3/042 (2006.01)
H03M 1/00 (2006.01)
G06F 3/041 (2006.01)
H03M 1/12 (2006.01)
H03M 1/46 (2006.01)

(52) U.S. Cl.
CPC .............. *G06F 3/042* (2013.01); *G06F 3/0412* (2013.01); *G06F 3/0416* (2013.01); *H03M 1/004* (2013.01); *H03M 1/1215* (2013.01); *H03M 1/46* (2013.01)

(58) Field of Classification Search
CPC ..... G06F 3/0412; G06F 3/0416; G06F 3/042; H03M 1/004; H03M 1/1215; H03M 1/46
USPC ........... 345/173–183, 207, 81, 204, 211, 107, 345/55, 76, 87, 530, 104; 361/283.1
See application file for complete search history.

(56) References Cited

U.S. PATENT DOCUMENTS

| | | | |
|---|---|---|---|
| 5,521,640 A | 5/1996 | Prater | |
| 5,990,948 A | 11/1999 | Sugiki | |
| 6,046,692 A | 4/2000 | Yamashiro et al. | |
| 6,396,471 B1 | 5/2002 | Hirakata | |
| 6,597,348 B1 | 7/2003 | Yamazaki et al. | |
| 6,628,263 B1 | 9/2003 | Konuma et al. | |

(Continued)

FOREIGN PATENT DOCUMENTS

| | | |
|---|---|---|
| EP | 0710034 A | 5/1996 |
| EP | 0793380 A | 9/1997 |

(Continued)

OTHER PUBLICATIONS

European Search Report (Application No. 10152718.2) Dated Apr. 8, 2014.

(Continued)

*Primary Examiner* — Kumar Patel
*Assistant Examiner* — Insa Sadio
(74) *Attorney, Agent, or Firm* — Nixon Peabody LLP; Jeffrey L. Costellia

(57) ABSTRACT

An embodiment of the present invention provides a touch panel that enable data sensing with multi-gray scale and an electronic device. At least a first pixel including a first photosensor portion detecting light with a first color, a second pixel including a second photosensor portion detecting light with a second color, a first A/D converter performing A/D conversion on an output signal of the first photosensor portion, and a second A/D converter performing A/D conversion on an output signal of the second photosensor portion are included. The voltage resolution of the first A/D converter and the voltage resolution of the second A/D converter are different.

12 Claims, 10 Drawing Sheets

(56) References Cited

U.S. PATENT DOCUMENTS

| | | |
|---|---|---|
| 6,638,781 B1 | 10/2003 | Hirakata et al. |
| 6,692,984 B2 | 2/2004 | Yonezawa et al. |
| 6,724,012 B2 | 4/2004 | Kimura |
| 6,747,290 B2 | 6/2004 | Yamazaki et al. |
| 6,747,638 B2 | 6/2004 | Yamazaki et al. |
| 6,825,492 B2 | 11/2004 | Yonezawa et al. |
| 6,844,868 B2 | 1/2005 | Hirakata |
| 6,972,753 B1 | 12/2005 | Kimura et al. |
| 7,068,254 B2 | 6/2006 | Yamazaki et al. |
| 7,068,255 B2 | 6/2006 | Hirakata |
| 7,161,185 B2 | 1/2007 | Yamazaki et al. |
| 7,173,281 B2 | 2/2007 | Hirakata et al. |
| 7,342,256 B2 | 3/2008 | Yamazaki |
| 7,351,605 B2 | 4/2008 | Yonezawa et al. |
| 7,365,750 B2 | 4/2008 | Yamazaki et al. |
| 7,525,523 B2 | 4/2009 | Yamazaki et al. |
| 7,602,373 B2 | 10/2009 | Hirakata |
| 7,605,902 B2 | 10/2009 | Hirakata et al. |
| 7,674,650 B2 | 3/2010 | Akimoto et al. |
| 7,732,819 B2 | 6/2010 | Akimoto et al. |
| 7,910,490 B2 | 3/2011 | Akimoto et al. |
| 7,932,521 B2 | 4/2011 | Akimoto et al. |
| 8,134,156 B2 | 3/2012 | Akimoto |
| 8,158,464 B2 | 4/2012 | Akimoto |
| 8,274,077 B2 | 9/2012 | Akimoto et al. |
| 8,368,079 B2 | 2/2013 | Akimoto |
| 8,466,463 B2 | 6/2013 | Akimoto et al. |
| 8,487,902 B2 | 7/2013 | Nako |
| 8,525,165 B2 | 9/2013 | Akimoto |
| 8,629,069 B2 | 1/2014 | Akimoto et al. |
| 8,669,550 B2 | 3/2014 | Akimoto et al. |
| 8,790,959 B2 | 7/2014 | Akimoto et al. |
| 8,796,069 B2 | 8/2014 | Akimoto et al. |
| 2001/0031074 A1* | 10/2001 | Yamazaki et al. ............ 382/124 |
| 2002/0011972 A1* | 1/2002 | Yamazaki et al. ............ 345/74.1 |
| 2003/0146991 A1* | 8/2003 | Barna et al. ................... 348/302 |
| 2004/0174324 A1 | 9/2004 | Yamazaki et al. |
| 2004/0189567 A1 | 9/2004 | Kimura |
| 2004/0217928 A1 | 11/2004 | Yamazaki et al. |
| 2005/0212916 A1 | 9/2005 | Nakamura et al. |
| 2005/0253942 A1 | 11/2005 | Muramatsu et al. |
| 2006/0066537 A1 | 3/2006 | Kimura et al. |
| 2007/0058063 A1* | 3/2007 | Hashimoto ................... 348/311 |
| 2007/0108454 A1 | 5/2007 | Yamazaki et al. |
| 2008/0129653 A1 | 6/2008 | Yamazaki |
| 2008/0158217 A1 | 7/2008 | Hata et al. |
| 2009/0040445 A1 | 2/2009 | Hirakata et al. |
| 2009/0141004 A1 | 6/2009 | Yamazaki |
| 2009/0201269 A1 | 8/2009 | Kato et al. |
| 2009/0295769 A1 | 12/2009 | Yamazaki et al. |
| 2010/0134457 A1 | 6/2010 | Katoh et al. |

FOREIGN PATENT DOCUMENTS

| | | |
|---|---|---|
| JP | 07-302168 | 11/1995 |
| JP | 10-117144 | 5/1998 |
| JP | 11-237948 | 8/1999 |
| JP | 2001-292276 | 10/2001 |
| JP | 2002-033823 | 1/2002 |
| JP | 2003-258643 | 9/2003 |
| JP | 2007-011152 | 1/2007 |
| JP | 2007-183706 | 7/2007 |
| WO | WO-2008/126768 | 10/2008 |
| WO | WO-2009/028652 | 3/2009 |

OTHER PUBLICATIONS

European Office Action (U.S. Appl. No. 10152718.2) Dated Jun. 19, 2015.

* cited by examiner

TOUCH PANEL

BACKGROUND OF THE INVENTION

1. Field of the Invention

The present invention relates to a touch panel having a touch sensor. In addition, the present invention relates to an electronic device provided with the touch panel.

2. Description of the Related Art

In recent years, a display device provided with a touch sensor has attracted attention. The display device provided with a touch sensor is called a touch panel, a touch screen, and the like (hereinafter simply referred to as a "touch panel"). Examples of the touch sensor include a resistive touch sensor, a capacitance touch sensor, and an optical touch sensor, which are different from each other in operation principle. In any of the sensors, an object to be detected is in contact with a display device or in the vicinity of the display device, whereby data can be input.

A display screen also serves as an input region by provision of a sensor (also referred to as a "photosensor") which detects light as an optical touch sensor for a touch panel. As an example of a device including such an optical touch sensor, a display device having an image capturing function, which is provided with a contact area sensor that captures an image, is given (e.g., see Reference 1). In the case of the touch panel having an optical sensor, light is emitted from the touch panel. In the case where an object to be detected exists at a given position of the touch panel, light at the region where the object exists is blocked by the object, and part of the light is reflected. A photosensor (also referred to as a "photoelectric conversion element") which can detect light is provided in a pixel of the touch panel, and the photosensor detects the reflected light, so that the existence of the object in the region where light is detected can be recognized.

In addition, it has been attempted to provide a personal authentication function or the like for an electronic device typified by a portable information terminal such as a mobile phone (e.g., see Reference 2). A finger print, a face, a hand print, a palm print, a pattern of hand veins, and the like are used for personal authentication. In the case of where a portion other than the display portion has a personal authentication function, the number of components increases, and the weight or price of the electronic device could possibly increase.

In addition, as for touch sensor systems, known is a technique for selecting an image processing method by which the position of a finger-tip is detected in accordance with brightness of external light (e.g., see Patent Document 3).

REFERENCE

[Patent Document 1] Japanese Published Patent Application No. 2001-292276
[Patent Document 2] Japanese Published Patent Application No. 2002-033823
[Patent Document 3] Japanese Published Patent Application No. 2007-183706

SUMMARY OF THE INVENTION

When a touch panel is used for an electronic device having a personal authentication function, high-resolution images need to be captured. For example, an effective way is that a photosensor is provided in each pixel of the touch panel, and electric signals generated by detection of light performed by the photosensors which detect light, are collected and image processing is performed so that personal authentication is realized. In addition, in order to realize a high degree of personal authentication function, it is necessary to collect data not in monochrome but in color with multi-gray scale. That is, it is necessary for the photosensors in the pixels to detect light of each of R, G, and B with high accuracy. However, in general, sensitivities to R, G, and B of a photosensor are different. Therefore, it is not easy to collect high-resolution color data.

In view of the above problem, the present invention provides a touch panel that enables data sensing with multi-gray scale by converting an electric signal data obtained from photosensors which detect light of R, G, and B from analog into digital with the use of an A/D converter capable of changing voltage resolution in accordance with the colors of R, G, and B.

In a touch panel in the present invention, a photosensor is mounted on each of pixels of R, G, and B. Further, in a touch panel where a successive approximation A/D converter is provided for every pixel column, the potential of a D/A converter included in the A/D converter is changed in accordance with a voltage range of an electric signal obtained by a photosensor in each of the pixels of R, G and B. Accordingly, a voltage for one gray scale level which can be detected by the A/D converter is changed. That is, even if the photosensor has difference sensitivities to R, G, and B, high-resolution sensing can be realized in the touch panel.

According to one embodiment of the present invention is a touch panel includes at least a first pixel including a first photosensor portion detecting light with a first color, a second pixel including a second photosensor portion detecting light with a second color, a first A/D converter performing A/D conversion on an output signal of the first photosensor portion, and a second A/D converter performing A/D conversion on an output signal of the second photosensor portion. The voltage resolution of the first A/D converter and the voltage resolution of the second A/D converter are different.

The first pixel and the second pixel each include a display element portion. The first photosensor portion and the second photosensor portion each include a photodiode and a transistor. Further, the first A/D converter and the second A/D converter each include a D/A converter and a comparator.

One embodiment of the present invention can provide a touch panel that enables data sensing with multi-gray scale.

BRIEF DESCRIPTION OF THE DRAWINGS

In the accompanying drawings.

DETAILED DESCRIPTION OF THE INVENTION

Hereinafter, embodiments of the present invention will be described in detail with reference to the accompanying drawings. Note that the present invention is not limited to the description below, and it is easily understood by those skilled in the art that a variety of changes and modifications can be made without departing from the spirit and scope of the present invention. Therefore, the present invention should not be limited to the descriptions of the embodiment modes and the embodiment below.

Embodiment 1

In this embodiment, a touch panel will be described with reference to FIGS. 1 to 7.

Figure 1:
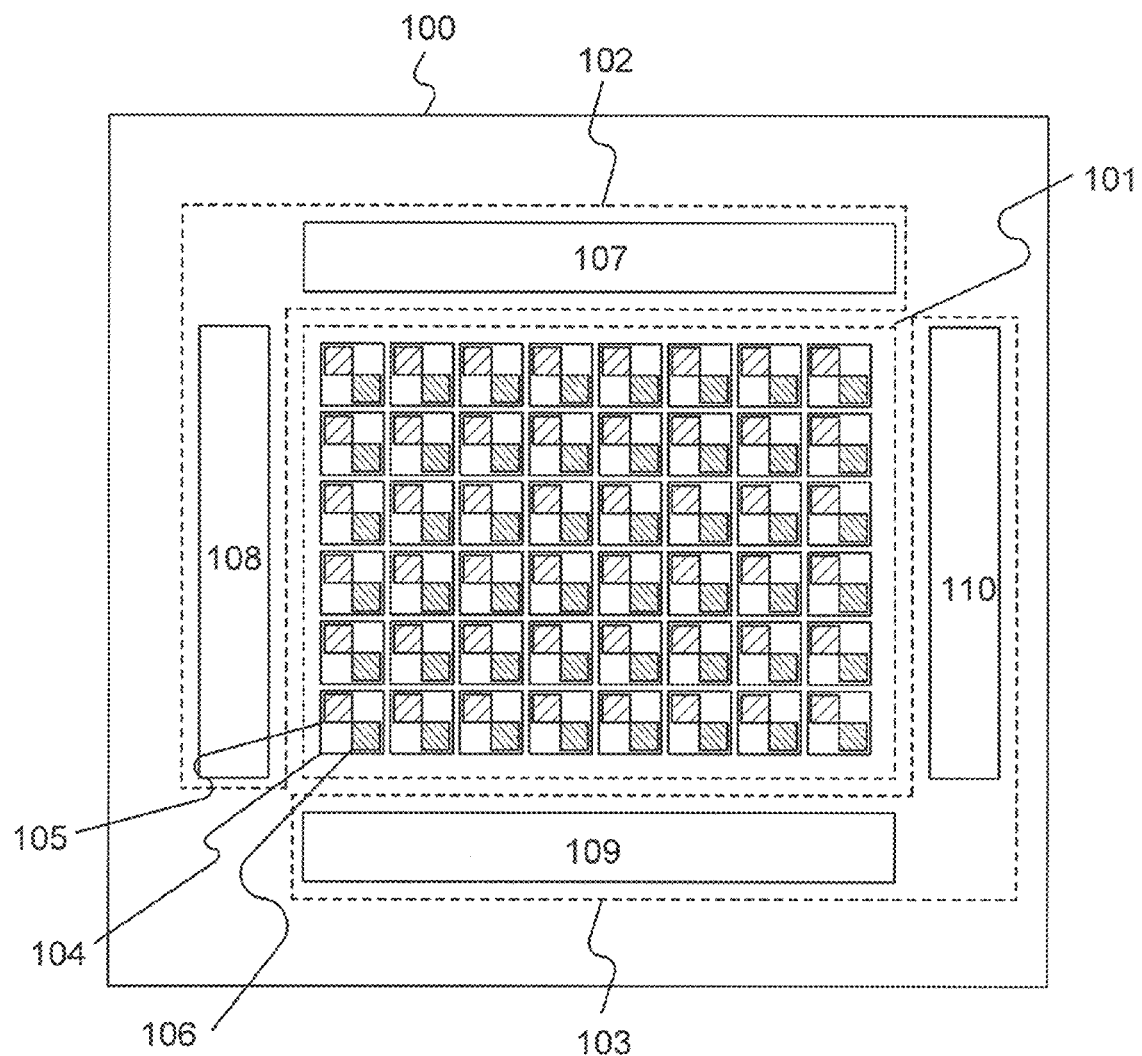
FIG. 1 illustrates a structure of a touch panel.

The structure of the touch panel will be described with reference to FIG. 1. A touch panel 100 includes a pixel portion 101, a display element control circuit 102, and a photosensor control circuit 103.

The pixel portion 101 includes a plurality of pixels 104. The pixels 104 each include a display element portion 105 and a photosensor portion 106. The plurality of pixels 104 are arranged in matrix. For example, the pixels 104 which detect light with a first color are provided in an n-th column (n is a natural number), the pixels 104 which detect light with a second color are provided in an (n+1)th column, and the pixels 104 which detect light with a third color are provided in an (n+2)th column. The first color, the second color, and the third color represent, for example, R (red), G (green), and B (blue). In addition, a red color filter is provided so as to overlap with the pixels 104 detecting red light, a green color filter is provided so as to overlap with the pixels 104 detecting green light, and a blue color filter is provided so as to overlap with the pixels 104 detecting blue light.

The display element portion 105 includes a thin film transistor (TFT), a storage capacitor, a liquid crystal layer, a color filter, and the like. In the touch panel 100, the fact that polarization direction varies when voltage is applied to the liquid crystal layer is used for making the tone (gray scale) of light passing through the liquid crystal layer, so that images can be displayed. External light or light source (backlight) emitted from the backside of a liquid crystal display device is used as the light which passes through the liquid crystal layer. In addition, the light which has passed through the liquid crystal layer passes through the color filter, so that the gray scale of specific colors (e.g., R, G, and B) can be made and color image display can be realized. The storage capacitor has a function of holding charges responsive to the voltage which is applied to the liquid crystal layer. The thin film transistor has a function of injecting or discharging charges to/from the storage capacitor.

Note that although the case where each of the display element portions 105 includes a liquid crystal element is described above, other elements such as a light emitting element may be included instead. In that case, for example, the pixels 104 each including the display element portion 105, which includes a light emitting element emitting light with the first color, and the photosensor portion 106, which detects light with the first color, are provided in an n-th column (n is a natural number); the pixels 104 each including the display element portion 105, which includes a light emitting element emitting light with the second color, and the photosensor portion 106, which detects light with the second color, are provided in an (n+1)th column, and the pixels 104 each including the display element portion 105, which includes a light emitting element emitting light with the third color, and the photosensor portion 106, which detects light with the third color, are provided in an (n+2)th column. In addition, in the case where the display element portion 105 includes a light emitting element, the color filter is not provided.

The photosensor portion 106 includes an element such as a photodiode, which has a function of generating an electric signal when receiving light, a transistor which controls the element, and the like. Note that as light which is received by the photosensor portion 106, reflected light or transmitted light obtained when external light or light from a backlight is shone on an object to be detected can be used. Here, the pixel 104 having a function of expressing red (R), the pixel 104 having a function of expressing green (G), and the pixel 104 having a function of expressing blue (B), which express the colors by using color filters, are called an R pixel, a G pixel, and a B pixel, respectively. Note that light with R, light with G and light with B included in reflected light or transmitted light obtained when external light or light from a backlight is shone on the object to be detected can be extracted by the photosensor portion 106 in an R pixel, the photosensor portion 106 in a G pixel, and the photosensor portion 106 in a B pixel, respectively.

The display element control circuit 102 includes a display element signal line driver circuit 107 and a display element scan line driver circuit 108 and controls the display element portions 105. For example, the display element scan line driver circuit 108 has a function of applying a high potential only to the display element portions 105 in a specific row. In addition, the display element signal line driver circuit 107 has a function of applying a given potential to the display element portions 105 in a specific column. Note that in the display element portion 105 to which the display element scan line driver circuit 108 applies a high potential, the transistor is conducting and the storage capacitor holds the potential supplied by the display element signal line driver circuit 107.

The photosensor control circuit 103 includes a photosensor signal line reading circuit 109 and a photosensor scan line driver circuit 110, and controls the photosensor portions 106. For example, the photosensor scan line driver circuit 110 has a function of operating only the photosensor portions 106 in a specific row. In addition, the photosensor signal line reading circuit 109 has a function of extracting output signals from the photosensor portions 106 in a specific column.

A circuit diagram of the pixel 104 will be described with reference to FIG. 2. The pixel 104 includes the display element portion 105 including a transistor 201, a storage capacitor 202, and a liquid crystal element 203, and the photosensor portion 106 including a photodiode 204, a transistor 205, and a transistor 206.

As for the transistor 201, a gate is electrically connected to a gate signal line 207, one of a source and a drain is electrically connected to a video data signal line 210, and the other one of the source and the drain is electrically connected to one electrode of the storage capacitor 202 and one electrode of the liquid crystal element 203. The other electrode of the storage capacitor 202 and the other electrode of the liquid crystal element 203 are each held at a certain potential. The liquid crystal element 203 includes a pair of electrodes and a liquid crystal layer sandwiched between the pair of electrodes.

When "H" (high) is applied to the gate signal line 207, the transistor 201 supplies the potential of the video data signal line 210 to the storage capacitor 202 and the liquid crystal element 203. The storage capacitor 202 holds the applied potential. The liquid crystal element 203 changes light transmittance in accordance with the applied potential.

As for the photodiode 204, one electrode is electrically connected to a photodiode reset signal line 208, and the other electrode is electrically connected to a gate of the transistor 205. As for the transistor 205, one of a source and a drain is electrically connected to a photosensor output signal line 211, and the other one of the source and the drain is electrically connected to one of a source and a drain of the transistor 206. As for the transistor 206, a gate is electrically connected to a gate signal line 209, and the other one of the source and the drain is electrically connected to a photosensor reference signal line 212.

Figure 3:
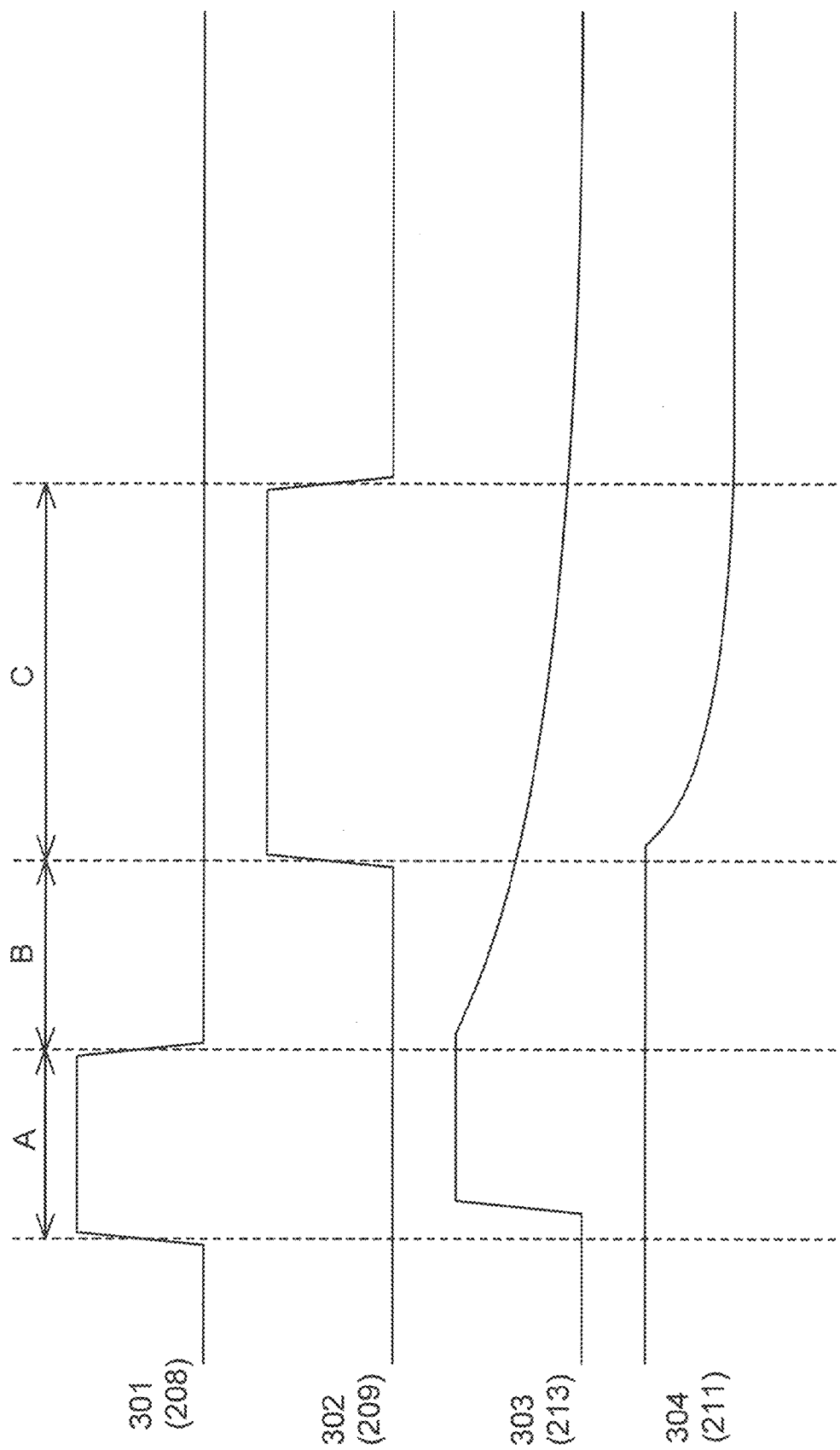
FIG. 3 is a timing chart.

Next, the operation of the pixel 104 will be described with reference to the timing chart of FIG. 3. In FIG. 3, a signal 301 corresponds to the potential of the photodiode reset signal line 208; a signal 302 corresponds to the potential of the gate signal line 209 to which the gate of the transistor 206 is connected; a signal 303 corresponds to the potential of a gate signal line 213 to which the gate of the transistor 205 is electrically connected; and a signal 304 corresponds to the potential of the photosensor output signal line 211.

In a period A, when the potential of the photodiode reset signal line 208 (the signal 301) is "H", the photodiode 204 is brought into conduction and the potential of the gate signal line 213 (the signal 303) to which the gate of the transistor 205 is connected becomes "H".

In a period B, when the potential of the photodiode reset signal line 208 (the signal 301) is "L", the potential of the gate signal line 213 to which the gate of the transistor 205 is connected (the signal 303) is lowered because of off current of the photodiode 204. The off current of the photodiode 204 increases when light is shone on the photodiode 204; therefore, the potential of the gate signal line 213 to which the gate of the transistor 205 is electrically connected (the signal 303) varies in accordance with the amount of the light shone on the photodiode 204. That is, the source-drain current of the transistor 205 (current which flows between the source and the drain) varies.

In a period C, when the potential of the gate signal line 209 (the signal 302) is "H", the transistor 206 is brought into conduction and electrical continuity is established between the photosensor reference signal line 212 and the photosensor output signal line 211 through the transistor 205 and the transistor 206. Since the potential of the photosensor output signal line 211 (the signal 304) is pre-charged to "H" in advance, the potential of the photosensor output signal line 211 decreases. Here, the speed with which the potential of the photosensor output signal line 211 decreases depends on the source-drain current (current which flows between the source and the drain) of the transistor 205. That is, the speed with which the potential of the photosensor output signal line 211 varies in accordance with the amount of light shone on the photodiode 204.

Figure 4:
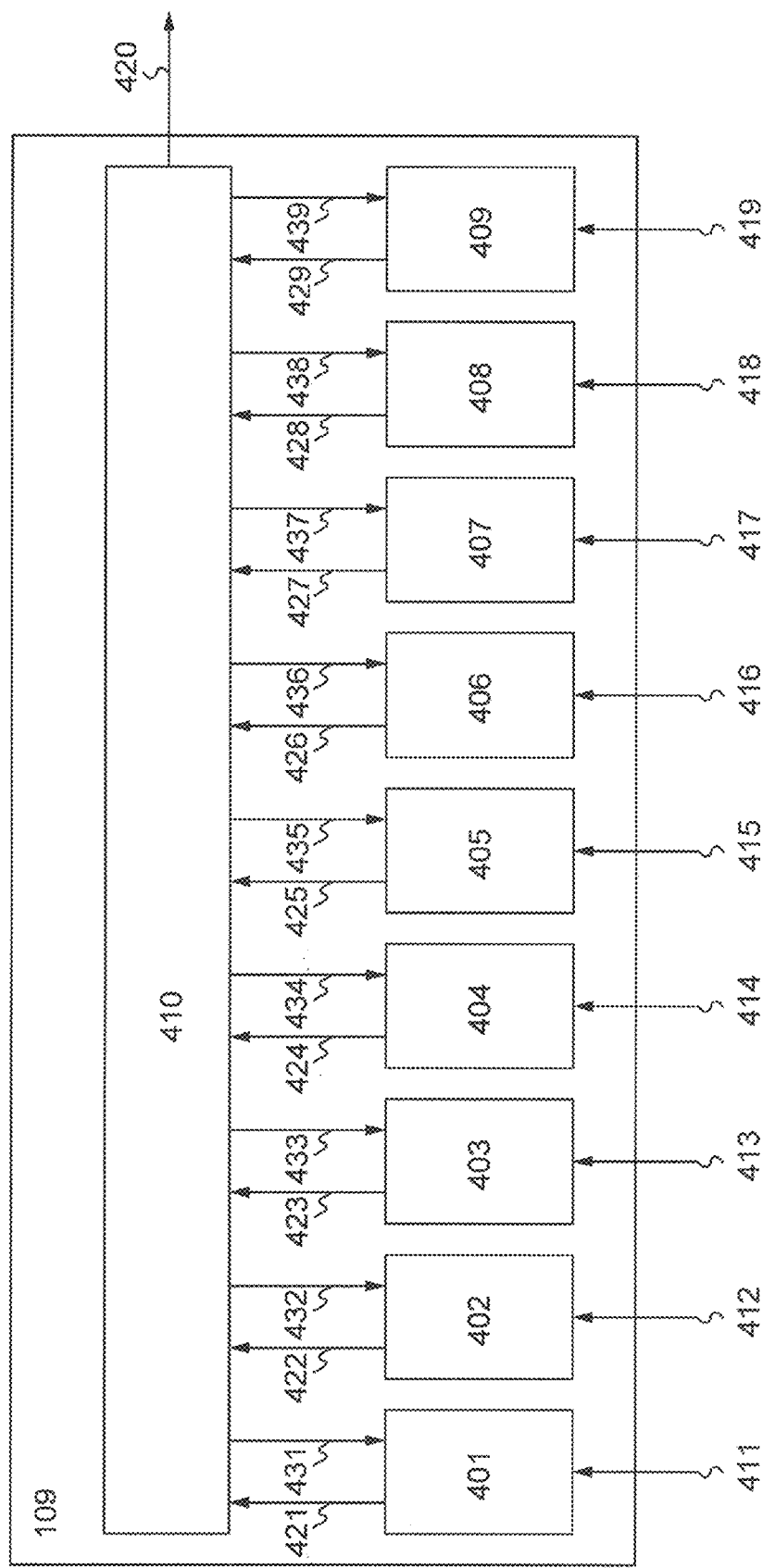
FIG. 4 illustrates a structure of the touch panel.
Figure 5:
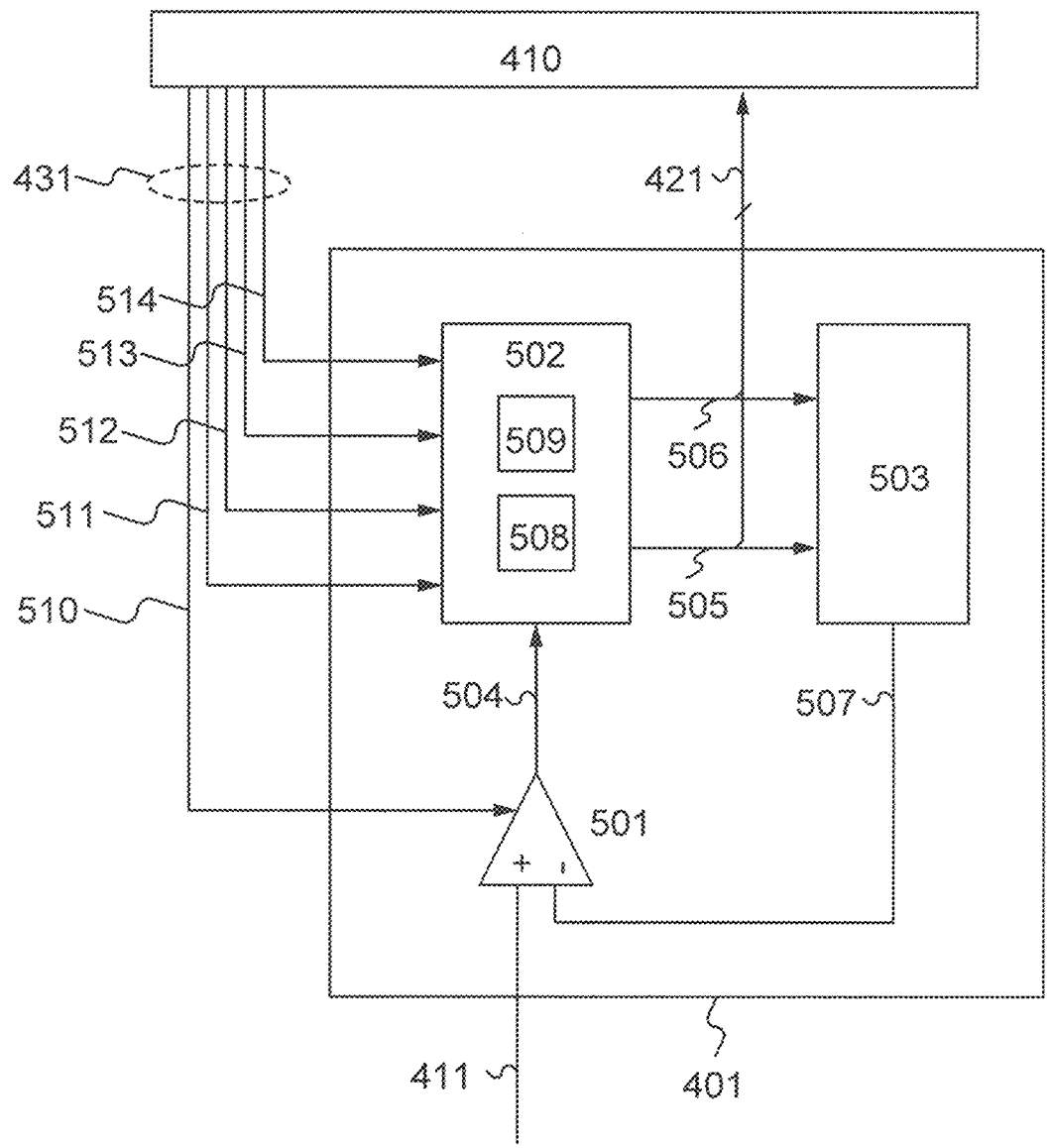
FIG. 5 illustrates a structure of the touch panel.

Next, the structure of the photosensor signal line reading circuit 109 illustrated in FIG. 1 will be described with reference to FIG. 4.

The photosensor signal line reading circuit 109 includes a first A/D converter circuit (hereinafter referred to as a first ADC) 401 to a ninth ADC 409 and an ADC control circuit 410. The photosensor signal line reading circuit 109 is connected to a first photosensor signal line 411 to a ninth photosensor signal line 419, a photosensor signal line reading circuit output signal line 420, a first ADC output signal line 421 to a ninth ADC output signal line 429, and a first ADC control signal line 431 to a ninth ADC control signal line 439. The first photosensor signal line 411 to the ninth photosensor signal line 419 are each connected to the photosensor output signal line 211 to which the photodiode 204 included in the pixel 104 is connected. Specifically, the first photosensor signal line 411 to the ninth photosensor signal line 419 are each connected to the photosensor output signal line 211 to which the photodiodes 204 included in the pixels 104 in one column in the pixel portion 101 is connected.

The ADC control circuit 410 generates a potential intended to be output to the photosensor signal line reading circuit output signal line 420 from the potential of each of the first ADC output signal line 421 to the ninth ADC output signal line 429. Specifically, one of the first ADC output signal line 421 to the ninth ADC output signal line 429 is selected and the potential of the selected signal line is output to the photosensor signal line reading circuit output signal line 420. Further, the ADC control circuit 410 generates a potential intended to be output to each of the first ADC control signal line 431 to the ninth ADC control signal line 439.

Next, the structure and operation of the first ADC 401 to the ninth ADC 409 will be specifically described. As a representative example, a structure and operation of the first ADC 401 will be described below with reference to FIG. 5.

In this case, the first ADC 401 is a 2-bit successive approximation A/D converter. The first ADC 401 includes a comparator (hereinafter referred to as a CMP) 501, a successive approximation register (hereinafter referred to as a SAR) 502, a D/A converter (hereinafter referred to as a DAC) 503, a CMP output signal line 504, a first SAR output signal line 505, a second SAR output signal line 506, a DAC output signal line 507, a first holding circuit 508, a second holding circuit 509, an ADC enable signal line 510, an ADC reset 1 signal line 511, an ADC reset 2 signal line 512, an ADC set 1 signal line 513, and an ADC set 2 signal line 514. The ADC enable signal line 510, the ADC reset 1 signal line 511, the ADC reset 2 signal line 512, the ADC set 1 signal line 513, and the ADC set 2 signal line 514 are collectively called the first ADC control signal line 431. The first SAR output signal line 505 and the second SAR output signal line 506 are included in the first ADC output signal line 421. That is, the first ADC output signal line 421 is a 2-bit signal line.

The CMP 501 uses the first photosensor signal line 411 and the DAC output signal line 507 as its input signal lines and compares the potential of the first photosensor signal line 411 and the potential of the DAC output signal line 507. Then, the CMP 501 outputs "H" or "L" to the CMP output signal line 504 according to comparison results. Here, "H" is output when the potential of the first photosensor signal line 411 is higher than that of the DAC output signal line 507, and "L" is output when the potential of the first photosensor signal line 411 is lower than that of the DAC output signal line 507. In addition, the operation of the CMP 501 can be started or stopped by controlling the potential of the ADC enable signal line 510. While the CMP 501 does not operate, power consumption of the CMP 501 can be significantly reduced. This can be realized, for example, by halting the supply of power voltage to the CMP 501. Here, when the potential of the ADC enable signal line 510 is "H" or "L", the operation of the CMP 501 is started or stopped.

The SAR 502 includes the first holding circuit 508 and the second holding circuit 509. The first holding circuit 508 holds a potential, which corresponds to the potential of the CMP output signal line 504, by control of the potential of the ADC set 1 signal line 513. The second holding circuit 509 holds a potential, which corresponds to the potential of the CMP output signal line 504, by control of the potential of the ADC set 2 signal line 514. The potential held in the first holding circuit 508 and the potential held in the second holding circuit 509 can be reset by control of the potential of the ADC reset 1 signal line 511. The potential held in the second holding circuit 509 can be reset by control of the potential of the ADC reset 2 signal line 512.

Each of the first holding circuit 508 and the second holding circuit 509 can be formed using a level sensitive latch, an edge sensitive latch, or the like. Here, each of the first holding circuit 508 and the second holding circuit 509 are formed using a level sensitive latch. In the case where the potential of the ADC set 1 signal line 513 (or the ADC set 2 signal line 514) is "H", if the potential of the CMP output signal line 504 is "H", "H" is held in the first holding circuit 508 (or the second holding circuit 509), and if the potential of the CMP output signal line 504 is "L", "L" is held in the first holding circuit 508 (or the second holding circuit 509). In addition, "H" is held in the first holding circuit 508 and "L" is held in the second holding circuit when the potential of the ADC reset 1 signal line 511 is "H", and "H" is held in the second holding circuit 509 when the potential of the ADC reset 2 signal line 512 is "H".

In the SAR 502, the potential held in the first holding circuit 508 and the potential held in the second holding circuit 509 are output to the first SAR output signal line 505 and the second SAR output signal line 506, respectively.

The DAC 503 outputs a potential, which is determined uniquely by the potential of the first SAR output signal line 505 and the potential of the second SAR output signal line 506, to the DAC output signal line 507. Here, when the combination of the potential of the first SAR output signal line 505 and the potential of the second SAR output signal line 506 is ("L", "L"), ("H", "L"), ("L", "H"), or ("H", "H"), 0 V, 1 V, 2 V, or 3 V, is output to the DAC output signal line 507, respectively. Such a DAC 503 can be realized by a resistance method or a capacitance method, or the like.

Next, an example of the operation of the First ADC 401 will be described with reference to the timing chart of FIG. 6.

Figure 6:
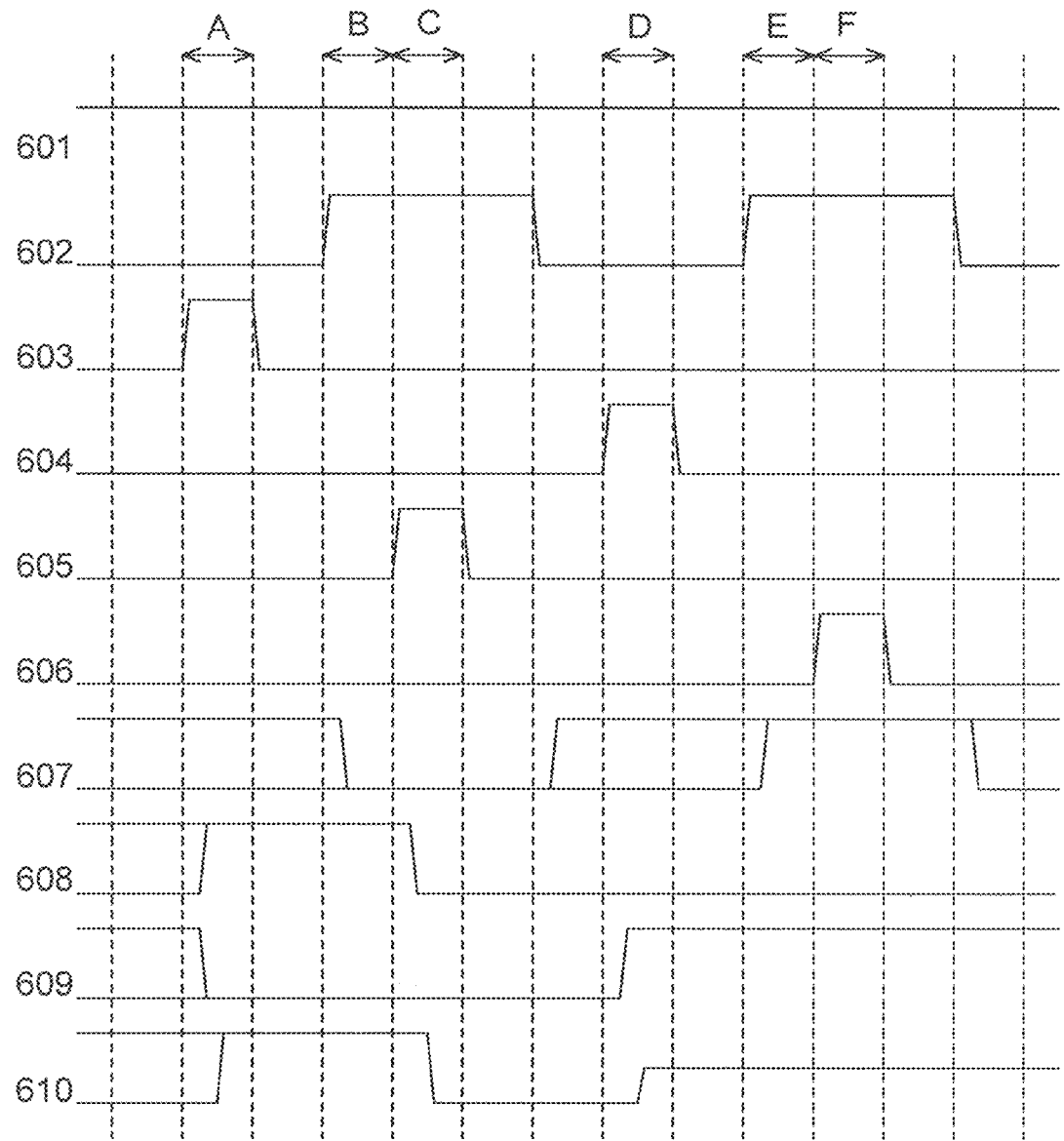
FIG. 6 is a timing chart.
Figure 7:
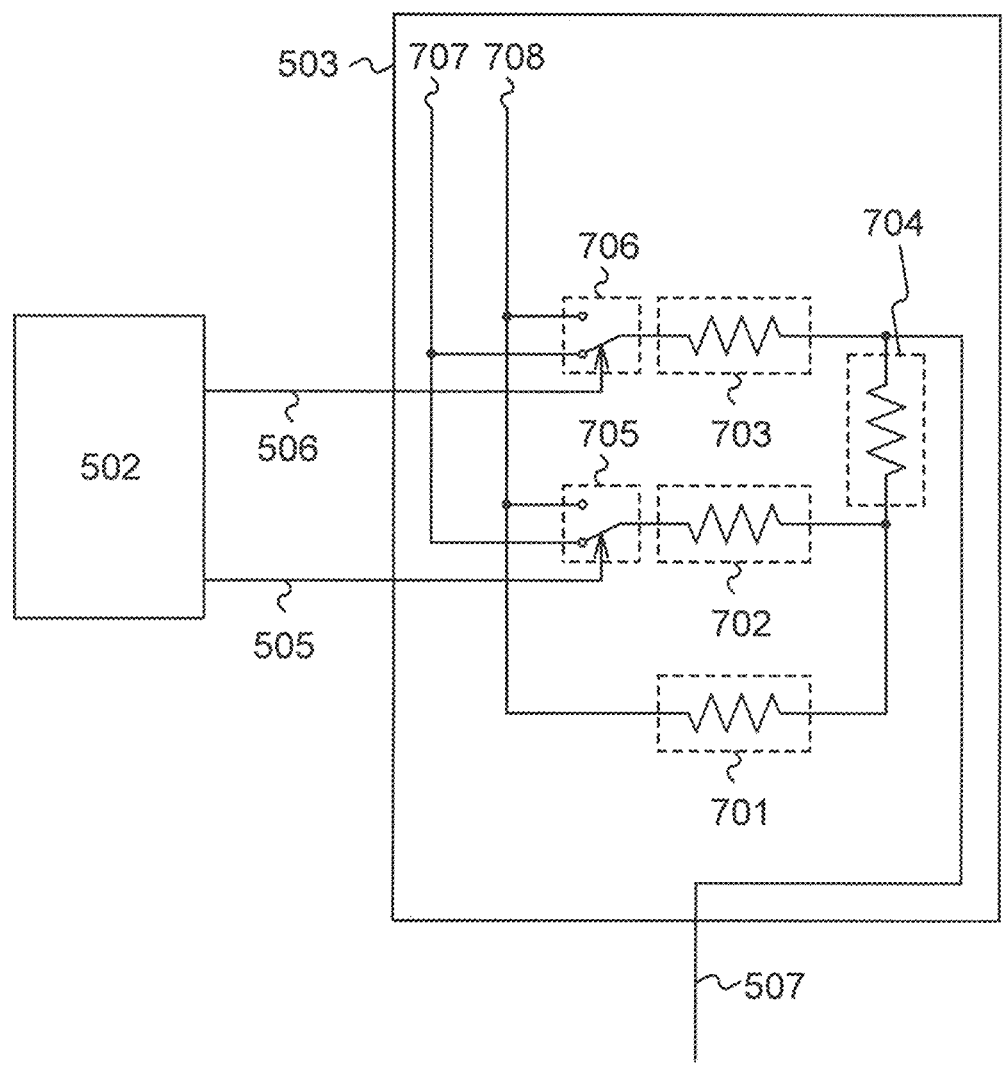
FIG. 7 illustrates a structure of the touch panel.

In FIG. 6, a signal 601 to a signal 610 correspond to potentials of the first photosensor signal line 411, the ADC enable signal line 510, the ADC reset 1 signal line 511, the ADC reset 2 signal line 512, the ADC set 1 signal line 513, the ADC set 2 signal line 514, the CMP output signal line 504, the first SAR output signal line 505, the second SAR output signal line 506, and the DAC output signal line 507, respectively. Note that the potential of the first photosensor signal line 411 (the signal 601) is, for example, 1.5V.

In the period A, if the potential of the ADC reset 1 signal line 511 (the signal 603) is set to "H", the potential held in the first holding circuit 508 and the potential held in the second holding circuit 509 are reset. Further, the potential of the first SAR output signal line 505 (the signal 608) becomes "H" and the potential of the second SAR output signal line 506 (the signal 609) becomes "L". Further, the potential of the DAC output signal line 507 (the signal 610) becomes 2V. In such a manner, a first setting of the potential of the DAC is performed in the period A.

In the period B, if the potential of the ADC enable signal line 510 (the signal 602) is set to "H", the CMP 501 operates. The CMP 501 compares the potential of the first photosensor signal line 411 (the signal 601, 1.5V) with the potential of the DAC output signal line 507 (the signal 610, 2V). Comparison results confirm that the potential of the DAC output signal line 507 (the signal 610) is higher; therefore, the potential of the CMP output signal line 504 (the signal 607) becomes "L". In such a manner, a first comparison between the potential of the DAC and a potential to be measured is performed in the period B. The comparison determines that the potential to be measured is from 0 V to 2V.

Next, if the potential of the ADC set 1 signal line 513 (the signal 605) is set to "H", "L" is held in the first holding circuit 508 and the potential of the first SAR output signal line 505 (the signal 608) becomes "L". Further, the potential of the DAC output signal line 507 (the signal 610) becomes 0V.

In the period D, if the potential of the ADC reset 2 signal line 512 (the signal 604) is set to "H", the potential held in the second holding circuit 509 is reset, and the potential of the second SAR output signal line 506 (the signal 609) becomes "H". Further, the potential of the DAC output signal line 507 (the signal 610) becomes 1V. In such a manner, in the period C and the period D, a second setting of the potential of the DAC is performed.

In a period E, if the potential of the ADC enable signal line 510 (the signal 602) is set to "H", the CMP 501 operates and compares the potential of the first photosensor signal line 411 (the signal 601, 1.5V) and the potential of the DAC output signal line 507 (the signal 610, 1V). Since the comparison determines that the potential of the DAC output signal line 507 (the signal 610) is lower, the potential of the CMP output signal line 504 (the signal 607) becomes "H". In such a manner, in the period E, a second comparison between the potential of the DAC and a potential to be measured is performed. The comparison determines that the potential to be measured is from 1 to 2V.

In the period F, if the potential of the ADC set 2 signal line 514 (the signal 606) is set to "H", the second holding circuit 509 is held "H". Here, since "H" is held in the second holding circuit 509 from the beginning, the potential of the second SAR output signal line 506 (the signal 609) remains "H" without changing. Further, the potential of the DAC output signal line 507 (the signal 610) remains 1V without changing. In such a manner, in the period F, a third setting of the potential of the DAC is performed.

In such a manner, the setting of the potential of the DAC is performed three times, and the comparison between the potential of the DAC and the potential to be measured is performed twice, whereby it is determined that the potential to be measured is from 1 to 2V, and whereby "L" or "H" is output, as A/D conversion data, from the first ADC output signal line 421.

As described above, in the successive approximation A/D converter, the potentials held in the first holding circuit 508 and the second holding circuit 509 which are included in the SAR 502 are changed. These changes lead to an operation in which an output of the DAC is successively changed, that is, a repetition of the setting of the potential of the DAC and the comparison between the potential of the output of the DAC and the potential to be measured. In such a way, a range of the potential to be measured is successively narrowed to determine the potential to be measured. Although a 2-bit A/D converter is described here, an A/D converter using a greater number of bits can operate with a similar method. In general, in the case where an n-bit A/D converter is used, a potential to be measured which is accurate to n-bit can be determined with settings of the potential of a DAC performed (n+1) times and comparisons between the potential of the DAC and a potential to be measured performed n times.

The ADC control circuit 410 (see FIG. 4) connected to the first ADC 401 to the ninth ADC 409 supplies control signals to the second ADC control signal line 432 to the ninth ADC control signal line 439 in a way similar to the first ADC control signal line 431 described above, and obtains output signals of the second ADC output signal line 422 to the ninth ADC output signal line 429 in a way similar to the first ADC output signal line 421.

Figure 2:
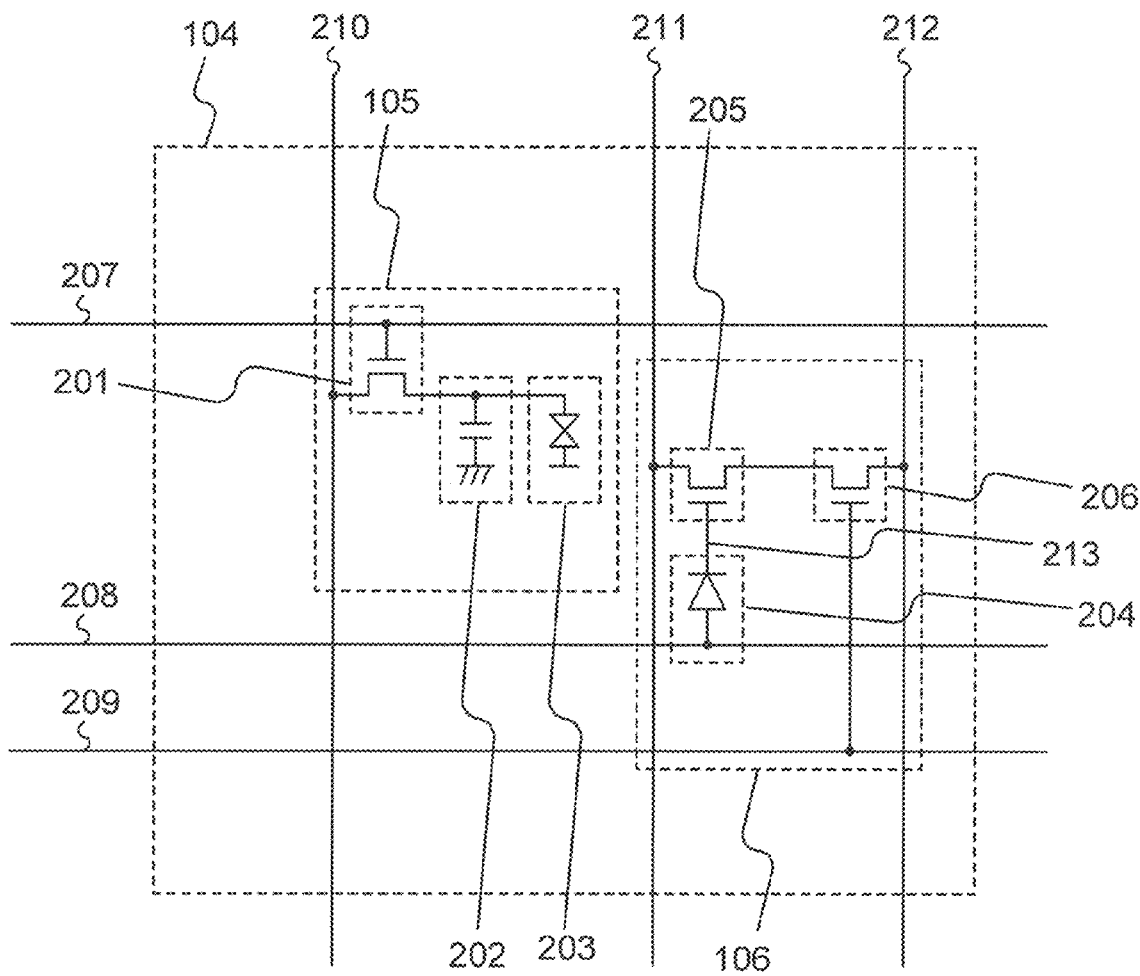
FIG. 2 illustrates a structure of the touch panel.

As shown in FIG. 2 and FIG. 3, the potential of the photosensor output signal line 211 varies in accordance with the amount of light shone on the photodiode 204. Therefore, with a measurement of a change in the potential of the photosensor output signal line 211, the amount of light can be obtained. It is known that the amount of current which flows in accordance with the amount of light with which a photodiode is irradiated depends on the wavelength of light. That is, the sensitivity of the photodiode depends on the wavelength of light. In other words, the degree of changes in the potential of the photosensor output signal line 211 differs according to light of R, G, and B. A general photodiode has its sensitivity to light of G which is ten times as high as that to light of R or B. That is, there are changes in the potential of the photosensor output signal line 211 in the case where light of R or light of B is detected by the photodiode, which is smaller than that in the potential of the photosensor output signal line 211 in the case where light of G is detected by the photodiode. Therefore, in the case where light of R or light of B is detected, it is necessary to improve the voltage resolution of the ADC so that smaller voltage changes can be detected.

Therefore, in an embodiment of the present invention, the voltage resolution of the first ADC 401 to the ninth ADC 409 is changed in accordance with a color of light detected by a photodiode. Specifically, the potential supplied to the DAC 503 included in each of the first ADC 401 to the ninth ADC 409 is changed. The structure and operation of the DAC 503 will be described below with reference to FIG. 7.

In this case, the DAC 503 is an R-2R ladder DAC. The DAC 503 includes a first resistor 701, a second resistor 702, a third resistor 703, a fourth resistor 704, a first switch 705, and a second switch 706. The resistance ratio of the first resistor 701 to the second resistor 702, the third resistor 703, and the fourth resistor 704 is 2:2:2:1.

As for the first switch 705 and the second switch 706, when the first SAR output signal line 505 and the second SAR output signal line 506 are each "H", a high potential line 707 (a potential VH) is selected. When the first SAR output signal line 505 and the second SAR output signal line 506 are each "L", a low potential line 708 (a potential VL) is selected. Therefore, when the combination of the potential of the first SAR output signal line 505 and the potential of the second SAR output signal line 506 is ("L", "L"), ("H", "L"), ("L", "H"), or ("H", "H"), the potential of the DAC output signal line 507 is (4VL+0VH)/4, (3VL+VH)/4, (2VL+2VH)/4, or (VL+3VH)/4, respectively. That is, the DAC 503 can generate an output in the range of VL to VH with voltage resolution of (VH−VL)/4.

with a potential to be measured (the potential of the first photosensor signal line 411). Therefore, the use of the DAC 503 shown in FIG. 7 realizes A/D conversion of a potential to be measured ranging from VL to VH with voltage resolution of (VH−VL)/4 in the first ADC 401. Accordingly, adjustment of the potential VH of the high potential line 707 and the potential VL of the low potential line 708 realizes A/D conversion of voltage in a predetermined range with predetermined voltage resolution.

Here the case where a general photodiode, that is, a photodiode whose sensitivity to light of G is 10 times as high as that to light of R or B is used is described. As described above with reference to FIG. 2 and FIG. 3, the changes in the potential of the photosensor output signal line 211 in the case where light of R or light of B is detected by the photodiode is smaller than in the case where light of G is detected by the photodiode. Therefore, in the case where light of R, G, and B are detected, the amount of light incident on the photodiode can be precisely detected by a method in which the potential VH of the high potential line 707 is set as an upper limit to a voltage range in which the potential of the photosensor output signal line 211 can change and the potential VL of the low potential line 708 is set as a lower limit to a voltage range in which the potential of the photosensor output signal line 211 can change. For example, in a circuit structure shown in FIG. 2, an increase in the amount of light incident on the photodiode leads to a reduction in the potential of the photosensor output signal line 211. Therefore, the potential VL of the low potential line 708 is set higher in the case where the photodiode detects light of R or B to which the sensitivity of the photodiode is low than in the case where the photodiode detects light of G to which the sensitivity of the photodiode is high.

The case where the photosensor portion 106 detects light of G and the case where the photosensor portion 106 detects light of R or B are separately described with reference to Table 1 providing specific figures.

TABLE 1

|  | Range in which potential of photosensor output signal line 211 can change | Potential VH of high potential line 707 | Potential VL of low potential line 708 | Potential which can be output from DAC output signal line 507 | Voltage resolution of ADC 401 |
| --- | --- | --- | --- | --- | --- |
| The case where the photosensor portion 106 detects light of G | 10 V to 4 V | 10 V | 4 V | 8.5 V, 7 V, 5.5 V, 4 V | 1.5 V |
| The case where the photosensor portion 106 detects light of R or B | 10 V to 6 V | 10 V | 6 V | 9 V, 8 V, 7 V, 6 V | 1 V |

For example, in the case where the potential VL of the low potential line 708 is 0V and the potential VH of the high potential line 707 is 4V, if the combination of the potential of the first SAR output signal line 505 and the potential of the second SAR output signal line 506 is ("L", "L"), ("H", "L"), ("L", "H"), or ("H", "H"), the potential of the DAC output signal line 507 is 0V, 1V, 2V, or 3V, respectively.

As described above, the first ADC 401 performs A/D conversion by successively comparing the output of the DAC 503

In Table 1, "range in which potential of photosensor output signal line 211 can change" signifies a range of changes in the potential of the photosensor output signal line 211 connected to the photosensor portion 106 which detects light of G, R, or B. "Potential VH of high potential line 707" and "potential VL of low potential line 708" signify potentials that are set in accordance with changes in the potential of the photosensor output signal line 211, "Potential which can be output from DAC output signal line 507" is, as described above, determined by the potential VH of the high potential line 707 and the potential VL of the low potential line 708, and determined by the equation of (4VL+0VH)/4, (3VL+VH)/4, (2VL+2VH)/4, or (VL+3VH)/4. "Voltage resolution of ADC 401" is determined by the equation of (VH−VL)/4.

In such a manner, the voltage resolution of the ADC can be improved in accordance with a color of light detected by the photodiode. Further, the improvement in the voltage resolution of the ADC realizes detection of small changes in the potential of the photosensor output signal line 211.

In this case, although the photodiode whose sensitivity to light of G is higher than that to light of R or B is described as a general photodiode, a photodiode having different characteristics from that photodiode can be used in a similar way. That is, a photodiode whose sensitivity to light of R is higher than that to light of G and B or a photodiode whose sensitivity to light of B is higher than that to light of R and G can be used in a similar way. Further, a photodiode whose sensitivity to light of R, sensitivity to light of G, and sensitivity to light of B are different can be used in a way similar to the above.

Note that in the case where the output potentials of photodiodes detecting light of R, G, and B are detected by different ADCs, an effective way is to determine and individually set the potentials VH and VL supplied to the high potential line and the low potential line which are included in each ADC by a method described the above. In addition, in the case where the output potentials of the photodiodes detecting light of R, G, and B are detected by the same ADC with time division, an effective way is to determine, by a method similar to the above, and change, each appropriate time, the potentials VH and VL supplied to the high potential line and the low potential line which are included in each ADC.

Accordingly, a touch panel that enables data sensing with multi-gray scale can be provided.

Embodiment 2

In this embodiment, the touch panel described in Embodiment 1 will be described with reference to FIGS. 8 and 9. In this embodiment, the touch panel includes a photosensor and a display element. The display element includes a liquid crystal element or a light emitting element.

Figure 8:
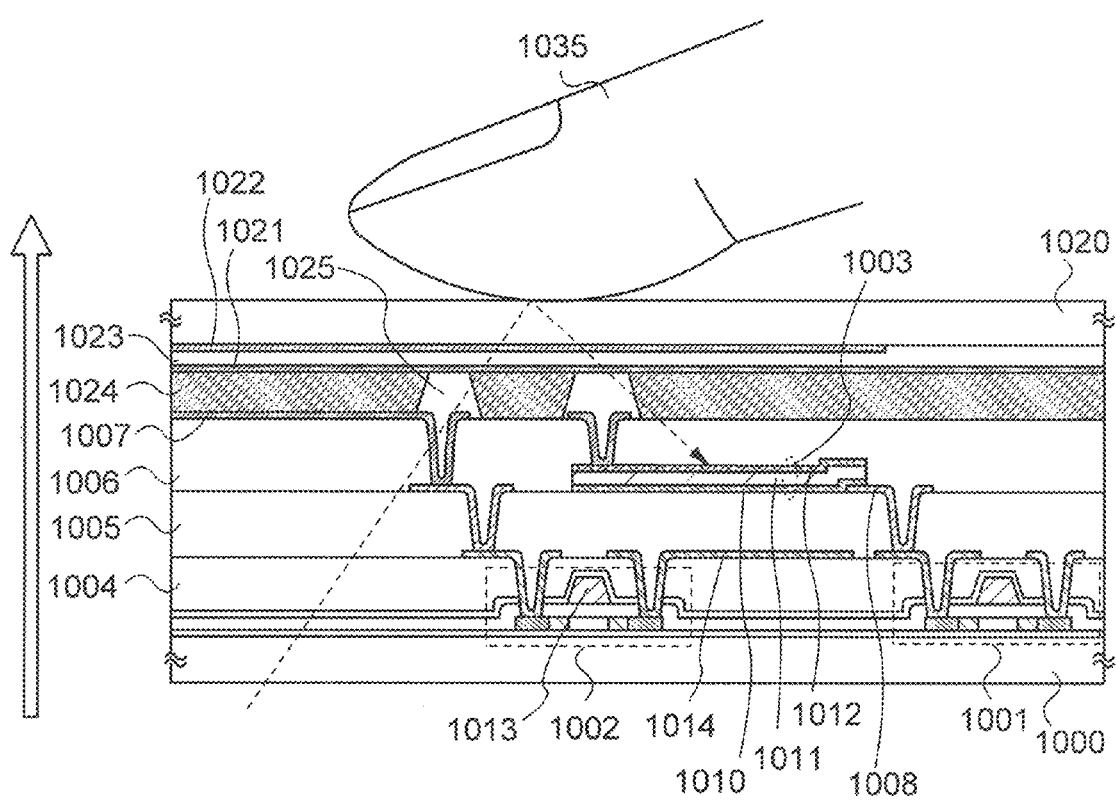
FIG. 8 illustrates a structure of a touch panel.

FIG. 8 illustrates, as for the touch panel described in Embodiment 1, an example of the cross-sectional view of a liquid crystal display device in which a display element includes a liquid crystal element. A situation is illustrated where light from a backlight reflects off a finger 1035, which is an object to be detected, and is shone on a photosensor 1003.

As a substrate 1000, a light-transmitting substrate such as a glass substrate or a quartz substrate is used. Over the substrate 1000, a thin film transistor 1001, a thin film transistor 1002, and a photosensor 1003 are provided. The photosensor 1003 is formed by stacking an n-type semiconductor layer 1010, an i-type semiconductor layer 1011, and a p-type semiconductor layer 1012 in the order presented. The n-type semiconductor layer 1010 contains an impurity element imparting n-type conductivity (e.g., phosphorus). The i-type semiconductor layer 1011 is an intrinsic semiconductor. The p-type semiconductor layer 1012 contains an impurity element imparting p-type conductivity (e.g., boron).

In FIG. 8, top gate thin film transistors are used as the thin film transistors 1001 and 1002; however, this embodiment is not limited to this. As the thin film transistors 1001 and 1002, bottom gate thin film transistor can also be used. Further, the photosensor 1003 includes the n-type semiconductor layer 1010, the i-type semiconductor layer 1011, and the p-type semiconductor layer 1012; however, this embodiment is not limited to this.

In this embodiment, a crystalline semiconductor layer can be used as each semiconductor layer included in the thin film transistor 1001 and the thin film transistor 1002. For example, polysilicon can be used; however, this embodiment is not limited to this. Amorphous silicon, single crystal silicon, organic semiconductor such as pentacene, oxide semiconductor, etc. can be used as each semiconductor layer included in the thin film transistor 1001 and the thin film transistor 1002. In order to form a semiconductor layer of single crystal silicon over the substrate 1000, the substrate 1000 is bonded to a single crystal silicon substrate in which a damaged region is provided at a predetermined depth from the surface, and the single crystal silicon substrate is separated at the damaged region. In addition, for the oxide semiconductor, a composite oxide of elements selected from indium, gallium, aluminum, zinc, and tin can be used.

An insulating layer 1004 is provided so as to cover the thin film transistors 1001 and 1002. An insulating layer 1005 is provided over the insulating layer 1004, and an insulating layer 1006 is provided over the insulating layer 1005. A pixel electrode 1007 is provided over the insulating layer 1006, and the photosensor 1003 and a lower electrode 1008 are provided over the insulating layer 1005. Owing to the lower electrode 1008, the photosensor 1003 and the thin film transistor 1001 are electrically connected to each other through an opening portion provided in the insulating layer 1005.

In addition, a counter substrate 1020 is provided with a counter electrode 1021, a color filter layer 1022, and an overcoat layer 1023. The counter substrate 1020 and the substrate 1000 are fixed to each other with a sealant, and the substrates are kept at a predetermined distance by a spacer 1025. A liquid crystal layer 1024 is interposed between the pixel electrode 1007 and the counter electrode 1021, whereby a liquid crystal element is formed.

The color filter layer 1022 may be provided so as to overlap with both the photosensor 1003 and the pixel electrode 1007 as shown in FIG. 8.

Further, the photosensor 1003 overlaps with a gate electrode 1013 of the thin film transistor 1002 as illustrated in FIG. 8 and the photosensor 1003 is preferably provided so as to overlap also with a signal line 1014 of the thin film transistor 1002.

A backlight is provided in the liquid crystal display device in this embodiment. In FIG. 8, the backlight is provided on the substrate 1000 side, and light is emitted in the direction indicated by a dotted arrow. For the backlight, a cold-cathode fluorescent lamp: (CCFL) or a white light emitting diode can be used. A white light-emitting diode is preferable because the adjustable range of brightness is wider than that of a cold-cathode fluorescent lamp.

Besides that, the brightness (luminance) of the backlight can be adjusted so as to enable a display appropriate for the circumstance where the touch panel is used by providing the photosensor 1003, for example, in a driver circuit portion to detect external light.

In addition, there is no limitation on the structure of the backlight above. For example, the backlight may include light-emitting diodes (LED) of. Further, a color display may be produced by a field sequential method in which the LED backlights of RGB are sequentially lit. A color filter layer is not necessary in that case.

Here, an example of the method for manufacturing the liquid crystal display device illustrated in FIG. 8 is briefly described.

First, top gate thin film transistors each including a crystalline semiconductor layer as active layers are formed. Here, the thin film transistor 1002 including the gate electrode 1013 and the thin film transistor 1001 which is electrically connected to the photosensor 1003 are formed over one substrate. An n-type thin film transistor or a p-type thin film transistor can be used as each transistor. In addition, a storage capacitor can be formed in the same steps as the transistors. Note that the storage capacitor may use the semiconductor layer as a lower electrode and a capacitor wiring as an upper electrode, and an insulating film, which is formed in the same steps as a gate insulating film of the thin film transistor 1001 and the thin film transistor 1002, as a dielectric.

Contact holes are formed in the insulating layer 1004 which is one of interlayer insulating layers of the thin film transistors. Then, a source electrode or a drain electrode, which is electrically connected to the semiconductor layer of each of the thin film transistors, or a connection electrode, which is connected to an upper wiring, is formed. Moreover, a signal line of the thin film transistor 1001 which is electrically connected to the photosensor 1003 is formed in the same steps. The signal line 1014 of the thin film transistor 1002 is formed in the same steps.

Next, the insulating layer 1005 which covers the signal line 1014 is formed. Note that since a transmissive liquid crystal display device is described as an example in this embodiment, the insulating layer 1005 uses an insulating material which transmits visible light. Then, contact holes are formed in the insulating layer 1005, and the lower electrode 1008 is formed over the insulating layer 1005.

Then, the photosensor 1003 is formed so as to overlap with at least part of the lower electrode 1008. The lower electrode 1008 is an electrode for electrically connecting the photosensor 1003 and the thin film transistor 1001. The photosensor 1003 is formed by stacking the n-type semiconductor layer 1010, the i-type semiconductor layer 1011, and the p-type semiconductor layer 1012 in the order presented. In this embodiment, with a plasma CVD method, the n-type semiconductor layer 1010 is formed using microcrystalline silicon containing phosphorus, the i-type semiconductor layer 1011 is formed using amorphous silicon, and the p-type semiconductor layer 1012 is formed using microcrystalline silicon containing boron.

Next, the insulating layer 1006 which covers the photosensor 1003 is formed. In the case of the transmissive liquid crystal display device, an insulating material which transmits visible light is used for the insulating layer 1006. Then, contact holes are formed in the insulating layer 1006, and the pixel electrode 1007 is formed over the insulating layer 1006. A wiring is formed from the same layer as that of the pixel electrode 1007. The wiring is electrically connected to the p-type semiconductor layer 1012 which is an upper electrode of the photosensor 1003.

Then, the spacer 1025 is foil red over the insulating layer 1006. A columnar spacer (a post spacer) is used as the spacer 1025 in FIG. 8; however, a spherical spacer (a bead spacer) can be used in a similar way.

Next, when a TN liquid crystal or the like is used as the liquid crystal layer 1204, an alignment film is formed over the pixel electrode 1007 by coating, and rubbing treatment is performed.

Meanwhile, the color filter layer 1022, the overcoat layer 1023, and the counter electrode 1021 are formed over the counter substrate 1020. Then, an alignment film is formed over the counter electrode 1021 by coating, and rubbing treatment is performed.

After that, a surface of the substrate 1000, over which the alignment film is formed by coating, and a surface of the counter substrate 1020, over which the alignment film is formed by coating, are attached to each other with a sealant. A liquid crystal is placed between these substrates by a liquid crystal dripping method or a liquid crystal injection method, whereby the liquid crystal layer 1024 is formed.

Alternatively, a blue-phase liquid crystal for which an alignment film is not necessary may be used for the liquid crystal layer 1024. A blue phase is one of the liquid crystal phases, which is generated just before a cholesteric phase changes into an isotropic phase while temperature of cholesteric liquid crystal is increased. Since the blue phase appears only in a narrow temperature range, in order that the blue phase may be applied to the liquid crystal layer 1024, a liquid crystal composition in which 5 wt. % or more of a chiral material is mixed to broaden the temperature range is used. As for the liquid crystal composition which contains a blue-phase liquid crystal and a chiral material, the response speed is as high as 10 μsec to 100 μsec, alignment treatment is not necessary due to optical isotropy, and viewing angle dependence is low.

Next, an electroluminescent display device (hereinafter referred to as an "EL display device"), in which a display element includes a light-emitting element, in the touch panel described in Embodiment 1, will be described.

Figure 9:
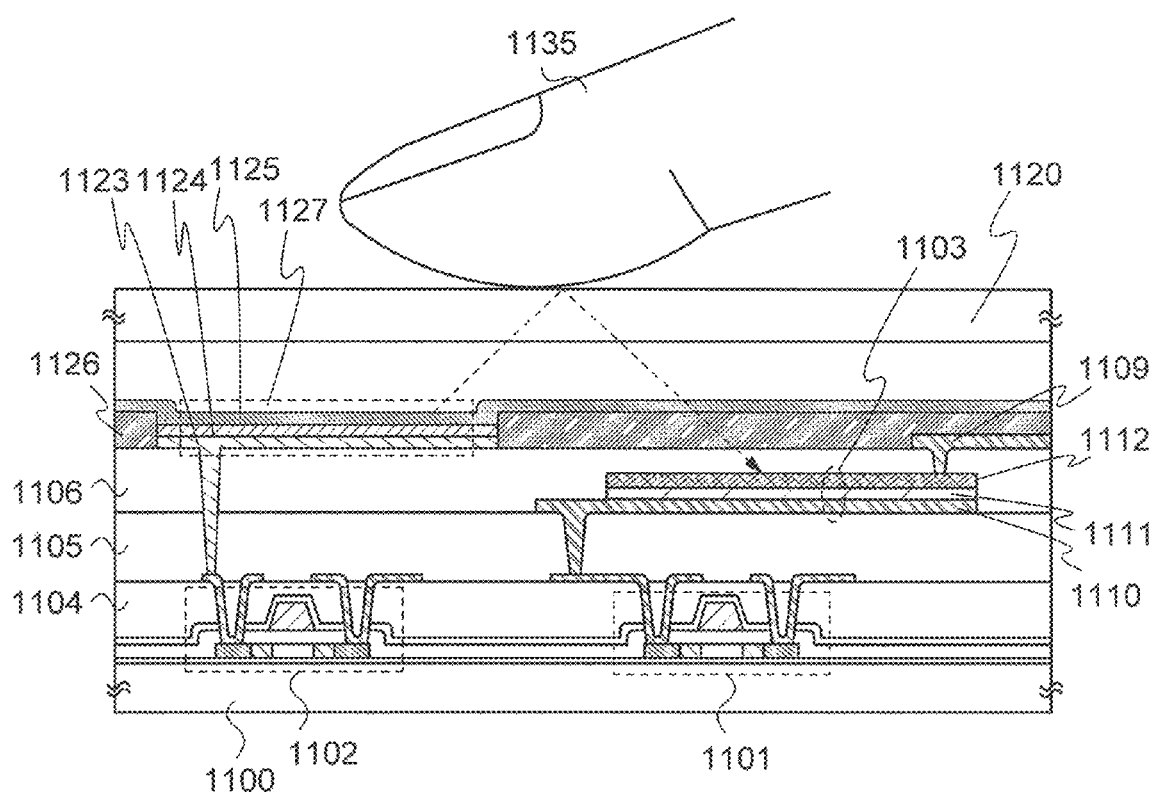
FIG. 9 illustrates a structure of a touch panel.

FIG. 9 illustrates an example of the cross-sectional view of an EL display element with an EL element (for example, an organic EL element, an inorganic EL element, or an EL element including an organic substance and an inorganic substance) as a light-emitting element in the touch panel above. A situation is illustrated where light emitted from an EL element 1127 reflects off a finger 1135, which is an object to be detected, and is shined on a photosensor 1103.

In FIG. 9, over a substrate 1100, a thin film transistor 1101, a thin film transistor 1102, and a photosensor 1103 are provided. The photosensor 1103 is formed by stacking an n-type semiconductor layer 1110, an i-type semiconductor layer 1111, and a p-type semiconductor layer 1112. The substrate 1100 is fixed to a counter substrate 1120 with a sealant.

An insulating layer 1104 is provided so as to cover the thin film transistors 1101 and 1102. An insulating layer 1105 is provided over the insulating layer 1104, and an insulating layer 1106 is provided over the insulating layer 1105. An EL element 1127 is provided over the insulating layer 1106, and the photosensor 1103 is provided over the insulating layer 1105. With the n-type semiconductor layer 1110, the photosensor 1103 and the thin film transistor 1101 are electrically connected through an opening portion provided in the insulating layer 1105.

Further, with a sensor wiring 1109, the p-type semiconductor layer 1112 and another wiring are electrically connected.

The EL element 1127 is formed by stacking a pixel electrode 1123, a light-emitting layer 1124, and a counter electrode 1125 in the order presented. Note that a bank 1126 separates light-emitting layers of pixels next to each other.

An n-type thin film transistor or a p-type thin film transistor can be used as each of the thin film transistor 1101 and the thin film transistor 1102. In the case where the pixel electrode 1123 functions as a cathode, the thin film transistor 1102, which is electrically connected to the pixel electrode 1123, is preferably made an n-type thin film transistor considering the direction of current. Further, in the case where the pixel electrode 1123 functions as an anode, the thin film transistor 1102 is preferably made a p-type thin film transistor.

Note that this embodiment can be freely combined with Embodiment described above.

Embodiment 3

In this embodiment, an example of an electronic device using a touch panel will be described with reference to FIGS. 10A to 10F.

Figure 10A:
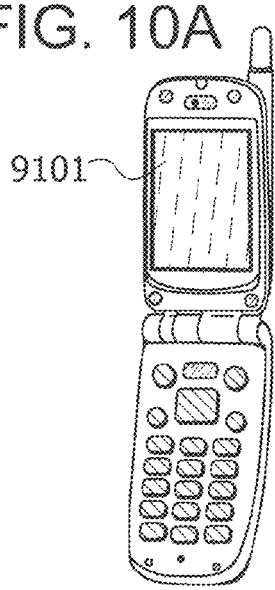
FIGS. 10A to 10F each illustrate an electronic device of the present invention.
Figure 10B:
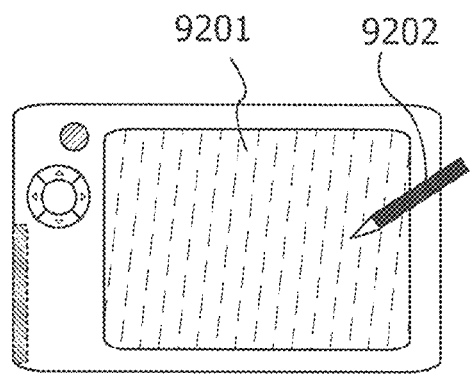
Figure 10C:
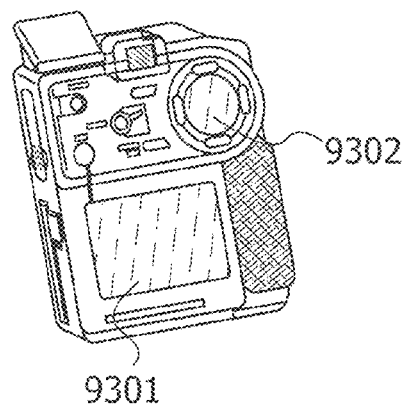
Figure 10D:
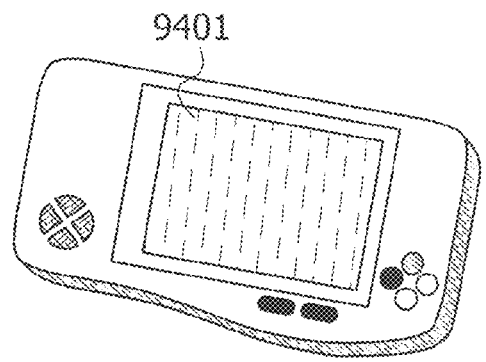
Figure 10E:
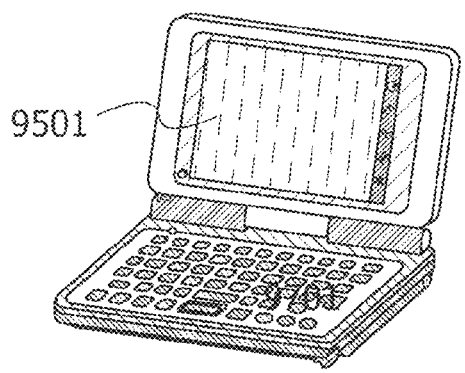
Figure 10F:
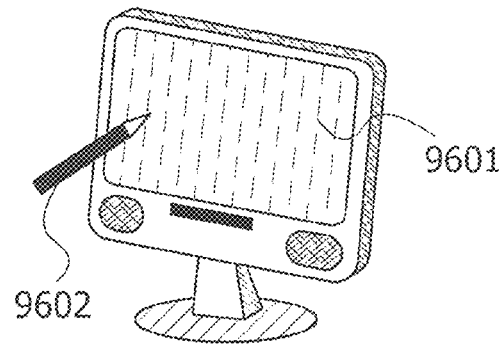

A mobile phone shown in FIG. 10A includes a display portion 9101. A portable information terminal shown in FIG. 10B includes a display portion 9201, an input pen 9202, and the like. A digital video camera shown in FIG. 10C includes a display portion 9301, a display portion 9302, and the like. A portable game machine shown in FIG. 10D includes a display portion 9401 and the like. A portable information terminal shown in FIG. 10E includes a display portion 9501 and the like. A television device shown in FIG. 10F includes a display portion 9601, an input pen 9602, and the like. The touch panel which is an embodiment of the present invention can be used for the electronic devices shown in FIGS. 10A to 10F. With the use of the touch panel which is an embodiment of the present invention, a touch panel that enables data sensing with multi-gray scale can be provided.

This application is based on Japanese Patent Application serial no. 2009-054921 filed with Japan Patent Office on Mar. 9, 2009, the entire contents of which are hereby incorporated by reference.

What is claimed is:

1. A touch panel comprising:
a first pixel including a first photosensor portion detecting light with a first color;
a second pixel including a second photosensor portion detecting light with a second color;
a first A/D converter performing A/D conversion on a first output signal of the first photosensor portion; and
a second A/D converter performing A/D conversion on a second output signal of the second photosensor portion,
wherein voltage resolution of the first A/D converter and voltage resolution of the second A/D converter are different,
wherein each of the first A/D converter and the second A/D converter comprises a D/A converter and a comparator being electrically connected to the D/A converter through a DAC output signal line,
wherein each of the first photosensor portion and the second photosensor portion comprises a transistor and a photodiode,
wherein one of a source and a drain of the transistor is electrically connected to the comparator through a photosensor signal line,
wherein a gate of the transistor is electrically connected to one electrode of the photodiode, and
wherein the comparator is configured to compare a potential of the DAC output signal line and a potential of the photosensor signal line.

2. The touch panel according to claim 1,
wherein the first color is a color selected from red, blue, and green, and
wherein the second color is a color selected from red, blue, and green and different from the first color.

3. A touch panel comprising:
a first pixel including a first photosensor portion detecting light with a first color and a first display element portion;
a second pixel including a second photosensor portion detecting light with a second color and a second display element portion;
a first A/D converter performing A/D conversion on a first output signal of the first photosensor portion; and
a second A/D converter performing A/D conversion on a second output signal of the second photosensor portion,
wherein voltage resolution of the first A/D converter and voltage resolution of the second A/D converter are different,
wherein each of the first A/D converter and the second A/D converter comprises a D/A converter and a comparator being electrically connected to the D/A converter through a DAC output signal line,
wherein each of the first photosensor portion and the second photosensor portion comprises a first transistor and a photodiode,
wherein one of a source and a drain of the first transistor is electrically connected to the comparator through a photosensor signal line,
wherein the one of the source and the drain of the first transistor is directly electrically connected to the photosensor signal line,
wherein a gate of the first transistor is directly electrically connected to one electrode of the photodiode, and
wherein the comparator is configured to compare a potential of the DAC output signal line and a potential of the photosensor signal line.

4. The touch panel according to claim 3,
wherein the first color is a color selected from red, blue, and green, and
wherein the second color is a color selected from red, blue, and green and different from the first color.

5. The touch panel according to claim 3,
wherein the first display element portion and the second display element portion each include a second transistor and a light emitting element.

6. The touch panel according to claim 3,
wherein the first display element portion and the second display element portion each include a second transistor and a liquid crystal element.

7. A touch panel comprising:
a first pixel including a first photosensor portion detecting light with a first color and a first display element portion;
a second pixel including a second photosensor portion detecting light with a second color and a second display element portion;
a first A/D converter performing A/D conversion on a first output signal of the first photosensor portion; and
a second A/D converter performing A/D conversion on a second output signal of the second photosensor portion,
wherein voltage resolution of the first A/D converter and voltage resolution of the second A/D converter are different,
wherein each of the first A/D converter and the second A/D converter comprises a D/A converter and a comparator being electrically connected to the D/A converter through a DAC output signal line,
wherein each of the first photosensor portion and the second photosensor portion comprises a first transistor and a photodiode,
wherein one of a source and a drain of the first transistor is electrically connected to the comparator through a photosensor signal line,
wherein the one of the source and the drain of the first transistor is directly electrically connected to the photosensor signal line,
wherein a gate of the first transistor is directly electrically connected to one electrode of the photodiode,
wherein the comparator is configured to compare a potential of the DAC output signal line and a potential of the photosensor signal line, and
wherein the first transistor comprises an oxide semiconductor.

8. The touch panel according to claim 7, wherein the first color is a color selected from red, blue, and green, and
wherein the second color is a color selected from red, blue, and green and different from the first color.

9. The touch panel according to claim 7,
wherein the first display element portion and the second display element portion each include a second transistor and a light emitting element.

10. The touch panel according to claim 7,
wherein the first display element portion and the second display element portion each include a second transistor and a liquid crystal element.

11. The touch panel according to claim 7,
wherein the D/A converter comprises a first resistor, a second resistor, a first switch and a second switch.

12. The touch panel according to claim 7, wherein the oxide semiconductor comprises a composite oxide of elements selected from indium, gallium, aluminum, zinc, and tin.

* * * * *